United States Patent
Wu et al.

(10) Patent No.: US 11,177,819 B1
(45) Date of Patent: Nov. 16, 2021

(54) POWER AND AREA EFFICIENT DIGITAL-TO-TIME CONVERTER WITH IMPROVED STABILITY

(71) Applicant: QUALCOMM Incorporated, San Diego, CA (US)

(72) Inventors: Zhengzheng Wu, Santa Cruz, CA (US); Chao Song, San Diego, CA (US); Karthik Nagarajan, Poway, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/111,208

(22) Filed: Dec. 3, 2020

(51) Int. Cl.
*H03M 1/06* (2006.01)
*H03M 1/82* (2006.01)
*G04F 10/00* (2006.01)

(52) U.S. Cl.
CPC ........... *H03M 1/0607* (2013.01); *H03M 1/82* (2013.01); *G04F 10/005* (2013.01)

(58) Field of Classification Search
CPC ...... H03M 1/0607; H03M 1/82; G04F 10/005
USPC .................................................. 341/144, 152
See application file for complete search history.

(56) References Cited

U.S. PATENT DOCUMENTS

| | | | |
|---|---|---|---|
| 4,973,978 A | 11/1990 | Jordan | |
| 7,319,419 B1 | 1/2008 | Lash et al. | |
| 9,362,936 B1* | 6/2016 | Caffee | H03K 5/135 |
| 9,531,394 B1 | 12/2016 | Caffee et al. | |
| 10,122,378 B2* | 11/2018 | Kim | H03K 5/131 |
| 10,498,352 B1 | 12/2019 | Caffee et al. | |

FOREIGN PATENT DOCUMENTS

CN 110908270 A 3/2020

\* cited by examiner

*Primary Examiner* — Khai M Nguyen
(74) *Attorney, Agent, or Firm* — Haynes and Boone, LLP

(57) ABSTRACT

A digital-to-time converter (DTC) converts a digital code into a time delay using a capacitor digital-to-analog converter (CDAC) that functions as a charging capacitor. The DTC includes a switched capacitor voltage-to-current converter for the formation of a charging current (or a discharging current) for charging (or for discharging) the charging capacitor responsive to a triggering clock edge that begins the time delay. A comparator compares a voltage on the charging capacitor to a threshold voltage to determine an end of the time delay.

30 Claims, 8 Drawing Sheets

POWER AND AREA EFFICIENT DIGITAL-TO-TIME CONVERTER WITH IMPROVED STABILITY

TECHNICAL FIELD

This application relates to digital-to-time converters, and more particularly to a power-efficient and area-efficient digital-to-time converter that is robust to process, voltage, and temperature variations.

BACKGROUND

Fractional-N phase-locked loops (PLLs) are key building blocks for frequency synthesizers as well as for low jitter clocking applications using a fixed frequency or spread-spectrum. To provide improved performance on phase noise and fractional spurs while achieving low power, digital-to-time converters (DTCs) are used in fractional-N PLLs. A DTC converts a digital code or word into a time delay, working as a true fractional frequency divider with high resolution in a PLL. DTCs are also basic building blocks suitable for other applications, including sampling oscilloscopes, direct digital frequency synthesis (DDFS), polar transmitters, radar, phased-array systems, and time-interleaved ADC timing calibrations.

It is known to use complementary metal-oxide semiconductor (CMOS) delay cells to form a DTC. But CMOS delay cells are sensitive to process, voltage, and temperature (PVT) variations. Improved supply noise robustness may be obtained by implementing a DTC with a capacitor-charging circuit. In some conventional approaches, the capacitor-charging circuit charges a capacitor according to a digital word that is being converted by the DTC into the time delay. A digital-to-analog converter (DAC) such as a resistive DAC (R-DAC) converts the digital word into an initial voltage (Vinit) for the charging capacitor. The Vinit-charged charging capacitor is then further charged with a constant current until the charging capacitor voltage reaches a threshold voltage (Vtrip). The time delay equals the delay from charging the Vinit-charged charging capacitor from Vinit to Vtrip. But the DAC consumes power and semiconductor die area. In addition, DTCs may suffer from process, voltage, and temperature variations.

SUMMARY

A circuit is provided that includes: a capacitive digital-to-analog converter including a common terminal and a plurality of capacitors; a first current source configured to charge the plurality of capacitors through the common terminal with a charging current; and a comparator having a first input terminal coupled to the common terminal.

In addition a method for a digital-to-time converter is provided that includes: charging an array of capacitors in a capacitive digital-to-analog converter responsive to a digital code to form a charged array of capacitors; responsive to a timing signal, further charging the charged array of capacitors through a common terminal with a charging current to form an increasing voltage for the common terminal; and determining when the increasing voltage equals a trip voltage.

Moreover, a circuit is provided that includes: a voltage-to-current switched capacitor converter configured to convert a reference voltage into a first current; a charging capacitor; a current mirror configured to mirror the first current into a charging current for charging the charging capacitor; and a comparator having a first input coupled to the charging capacitor and a second input configured to receive a trip voltage.

Finally, a circuit is provided that includes: a capacitive digital-to-analog converter including a common terminal and a plurality of capacitors; a first current source configured to discharge the plurality of capacitors with a discharging current conducted through the common terminal; and a comparator having a first input terminal coupled to the common terminal.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

A digital-to-time converter (DTC) is disclosed in which a capacitor DAC (CDAC) functions as a digitally-controlled voltage generator for a charging capacitor and also the charging capacitor itself. As compared to traditional charging-capacitor DTC architectures, the resulting DTC has improved power efficiency and occupies a reduced semiconductor die area. This reduction in the die space improves density as more circuits may be integrated into the same die space due to the reduced area for the digital-to-time converter implementation. A switched capacitor voltage-to-current converter is also disclosed for the generation of the charging current to the charging capacitor to improve stability with regard to process, voltage, and temperature variations.

Figure 1:
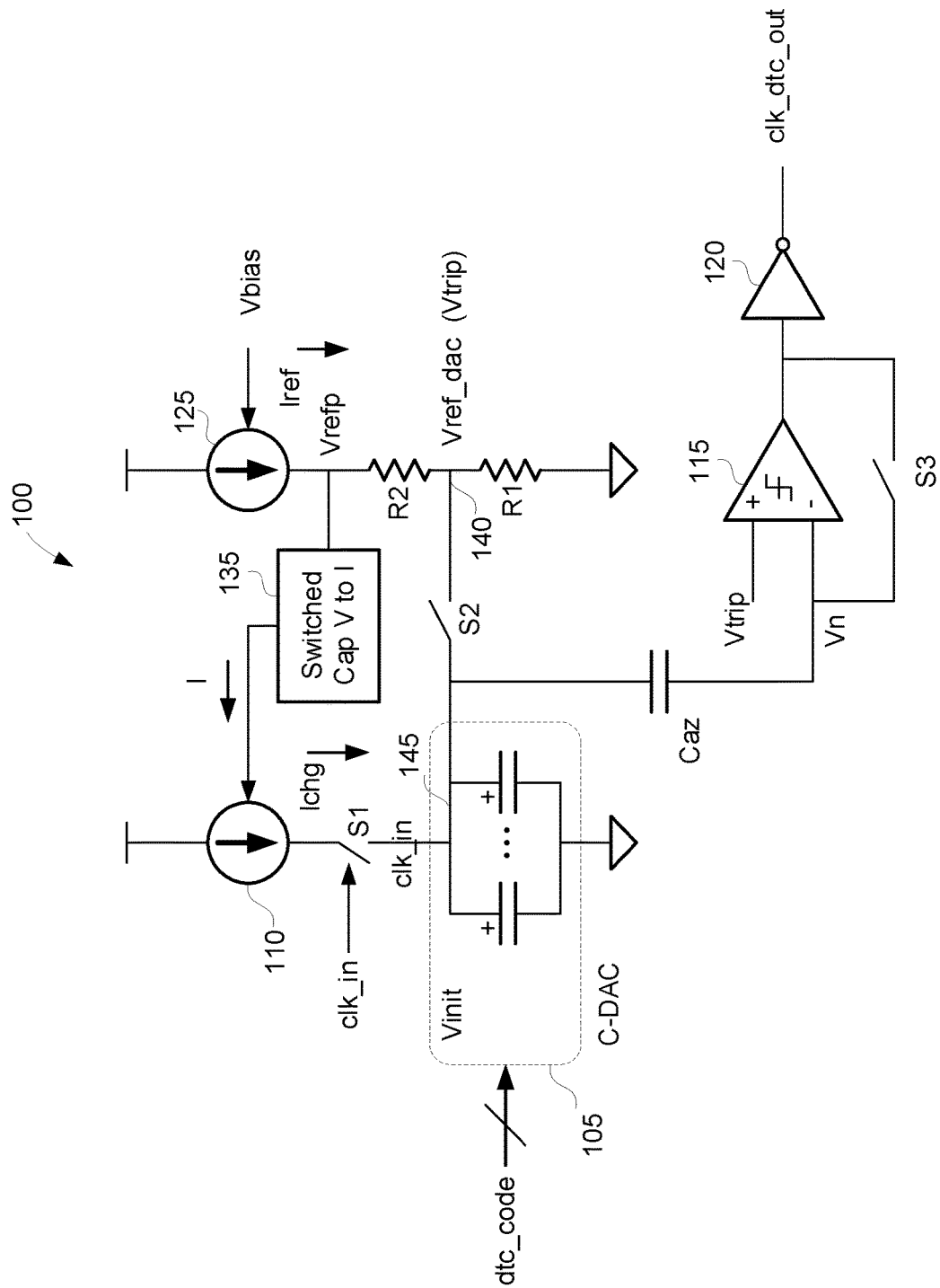
FIG. 1 is a diagram of an example DTC in which a capacitive DAC (CDAC) functions as the charging capacitor that is charged during the time delay in accordance with an aspect of the disclosure.

An example DTC 100 is shown in FIG. 1. A CDAC 105 includes a plurality of capacitors sharing a common terminal 145 that is charged to an initial voltage Vinit responsive to a digital DTC code (dtc_code). As will be explained further herein, CDAC 105 functions such that Vinit is a fraction of a DAC reference voltage (Vref_dac). The number of different fractions depends upon the resolution of CDAC 105 and its encoding. For example, in a 3-bit binary-encoded implementation, CDAC 105 can convert the DTC code dtc_code into one of eight possible settings for Vinit: 0 V, ⅛ Vref_dac, ¼ Vref_dac, ⅜ Vref_dac, ½ Vref_dac, ⅝ Vref_dac, ¾ Vref_dac, and ⅞ Vref_dac.

Since the plurality of capacitors in CDAC 105 are all connected in parallel with respect to common terminal 145 after being charged to Vinit, they function as a single charging capacitor. With the capacitors in CDAC 105 charged to Vinit, an edge (which may be a rising edge or a falling edge) of a timing signal such as an input clock signal (clk_in) triggers a switch S1 to close so that a current source such as a current mirror 110 begins to charge the capacitors with a constant charging current Ichg. A comparator 115 functions to compare the voltage of common terminal 145 in CDAC 105 to a threshold voltage Vtrip. The output signal from comparator 115 may be inverted by an inverter 120 to form an output clock signal (clk_dtc_out) for DTC 100 that is asserted to a power supply voltage at the end of the time delay. The time delay from DTC 100 thus equals the delay between the triggering edge of the input clock edge and the assertion of the output clock signal. In alternative implementation, comparator 115 may be configured such that the output clock signal has a falling edge (discharges to ground) at the end of the time delay.

Figure 2:
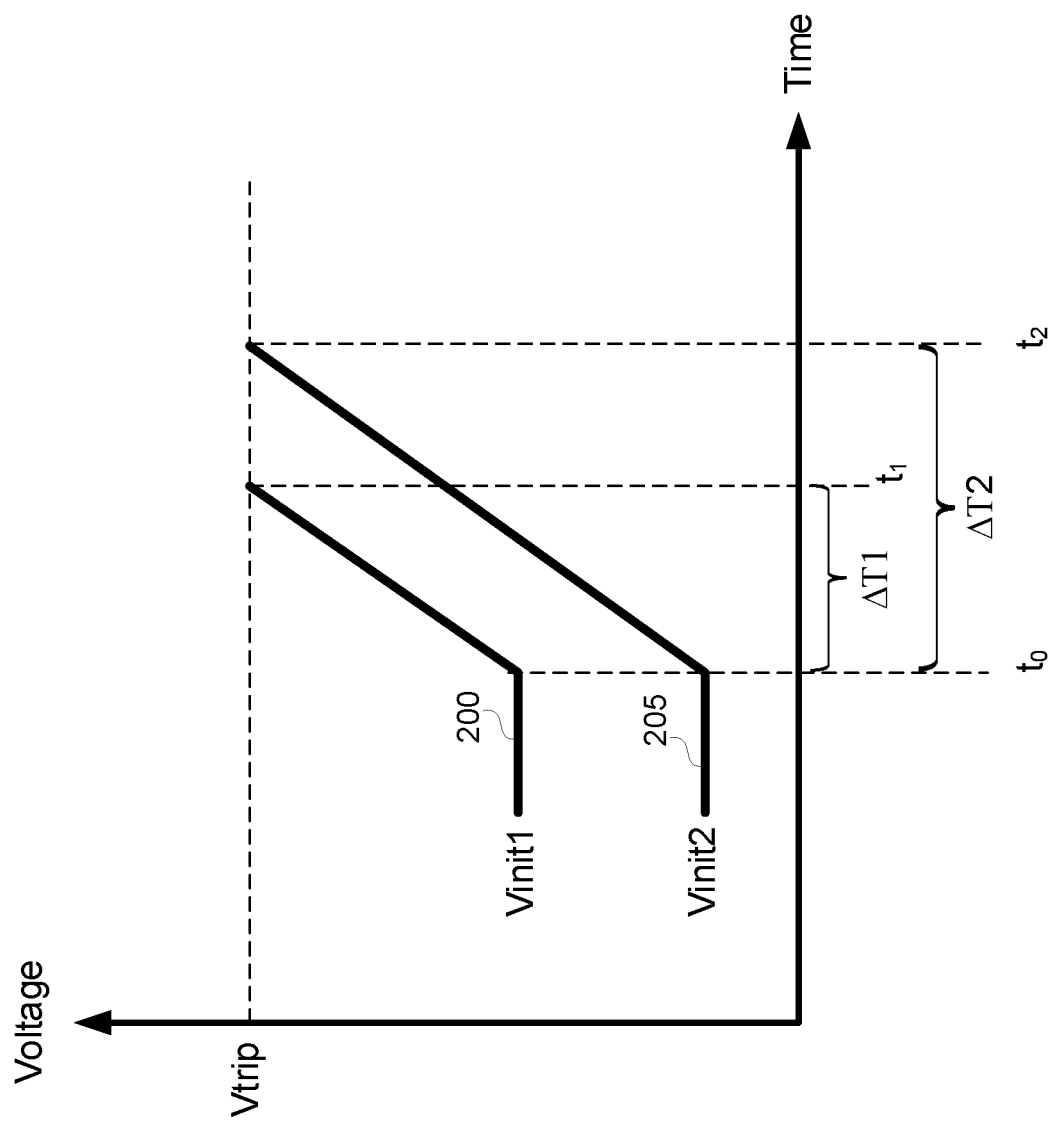
FIG. 2 illustrates some example voltage waveforms for the charging of the charging capacitor in the DCT of FIG. 1.

Some example waveforms for the charging of the capacitors in CDAC 105 are shown in FIG. 2. In the following discussion, the plurality of capacitors in CDAC 105 are referred to collectively as the charging capacitor since they are connected in parallel with regard to common terminal 145 in a charge redistribution phase in which the capacitors are charged to Vinit. In a first waveform 200, the charging capacitor is charged to an initial voltage Vinit1 that is greater than an initial voltage Vinit2 for a second waveform 205. The triggering edge of the input clock signal occurs at a time t0. Both waveforms increase linearly from the constant charging current Ichg. But waveform 200 reaches Vtrip at a time t1 that is sooner than a time t2 when waveform 205 reaches Vtrip due to Vinit1 being greater than Vinit2. A time delay $\Delta T1$ from time t0 to time t1 for waveform 200 is thus shorter than a time delay $\Delta T2$ from time t0 to time t2 for waveform 205.

Referring again to FIG. 1, any suitable current source may be used to charge the charging capacitor with the constant charging current Ichg when the switch S1 is closed. A particularly advantageous current source is formed by a switched capacitor voltage-to-current converter 135 that functions to make DTC 100 robust to process, voltage, and temperature variations as will be explained further herein. Switched capacitor voltage-to-current converter 135 converts an input reference voltage Vrefp into a first current I. A current source such as a current mirror 110 mirrors the first current I into a constant charging current Ichg that charges the charging capacitor. To generate the input reference voltage Vrefp, an exemplary current source 125 as biased by a bias voltage Vbias may drive a reference current Iref into a resistor. In DTC 100, current source 125 drives the reference current Iref into a pair of resistors R2 and R1 but it will be appreciated that a single resistor (or more than two resistors) may be used in alternative implementations. In an alternative implementation, a voltage reference circuit with a voltage buffer may be used in lieu of current source 125 to generate the input reference voltage Vrefp.

Resistors R2 and R1 are arranged in series between current source 125 and ground. Resistors R1 and R2 form a voltage divider such that a node 140 between resistors R1 and R2 is charged to a reference voltage Vref_dac that equals a divided version of the input reference voltage Vrefp depending upon the resistances for resistors R1 and R2. By an appropriate adjustment of these resistances, the output voltage range of CDAC 105 may be set relative to the input reference voltage Vrefp.

In some implementations, resistor R2 may be shorted or removed such that the reference voltage Vref_dac equals the input reference voltage Vrefp so that an offset of comparator 115 may be compensated as follows. If comparator 115 were perfect, it would discharge its output signal when its negative terminal input voltage Vn equals Vtrip at its positive input terminal. But due to non-idealities, comparator 115 may instead discharge its output signal when the negative terminal input voltage Vn equals Vtrip plus some offset voltage that may be positive or negative. To compensate for this offset voltage, an auto-zero sampling switch S3 that couples between the output of comparator 115 and its negative input terminal is closed during an auto-zero phase prior to the charging of the charging capacitor. In the auto-zero phase, a switch S2 that couples from the node 140 through an auto-zero capacitor Caz to the negative input terminal of comparator 115 is also closed to couple the reference voltage Vref_dac to a first terminal of the auto-zero capacitor Caz that has a second terminal connected to the negative input terminal of comparator 115. Due to the feedback through auto-zero switch S3 in the auto-zero phase, the auto-zero capacitor Caz will be charged with the offset voltage during the auto-zero phase. During normal operation, switches S2 and S3 are then opened. Due to the pre-charging of the auto-zero capacitor Caz to cancel the offset voltage, comparator 115 will then discharge its output signal and toggle the output of inverter 120 when the common terminal 145 is charged to the trip voltage Vtrip regardless of the offset voltage for comparator 115.

Figure 3:
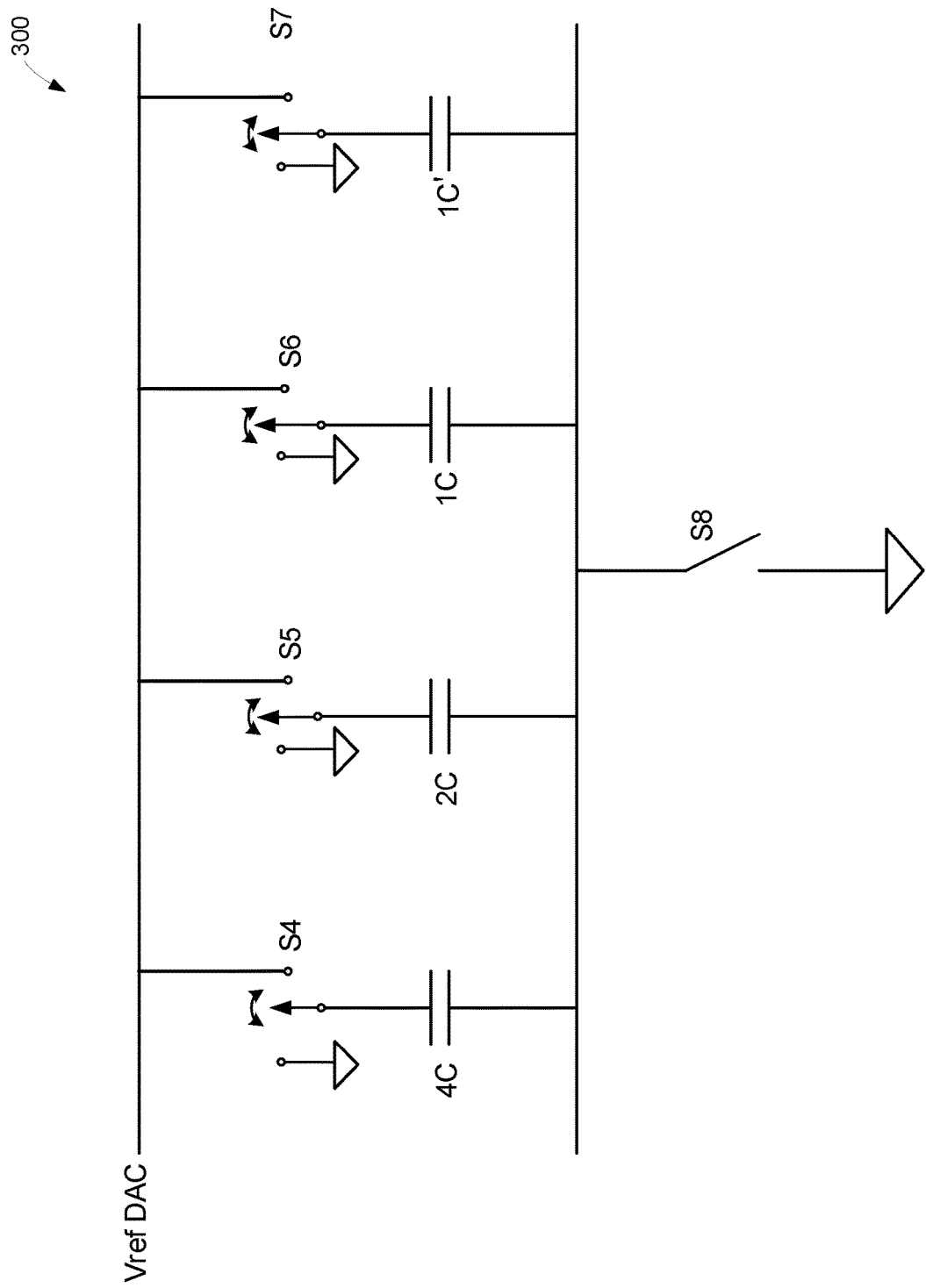
FIG. 3 is a circuit diagram of a binary-weighted CDAC for a DTC in accordance with an aspect of the disclosure.

CDAC 105 may be formed using any suitable encoding of its capacitors. An example binary-encoded CDAC 300 is shown in more detail in FIG. 3. The reference voltage Vref_dac flows through switch S2 during an initial charging stage to charge the common terminal 145 of an array of capacitors 305. CDAC 300 responds a three-bit wide digital code dtc_code so that the array of capacitors has four capacitors including a capacitor 4C, a capacitor 2C, a capacitor 1C, and second (or dummy) capacitor 1C'. As implied by the names, there is a binary progression to the capacitance for the capacitors such that capacitor 4C has twice the capacitance of capacitor 2C, which in turn has twice the capacitance of each of the 1C/1C' capacitors. Each capacitor has a first plate that couples to the common terminal 145 or ground through a corresponding switch such as a single-pole-double-throw switch (SPDT). For example, capacitor 4C has a first plate coupled to an SPDT switch S4, capacitor 2C has a first plate coupled to an SPDT switch S5, capacitor 1C has a first plate coupled to an SPDT switch S6, and capacitor 1C' has a first plate coupled to an SPDT switch S7. During the initial charging phase, a bottom switch S8 that couples between a second plate for each capacitor and ground is closed. The setting of each SPDT switch during the initial charging stage depends upon the DTC code. As discussed previously, a three-bit DTC code corresponds to eight different values of Vinit that range from, for example, from 0V to ⅞ Vref_dac. For the 0V setting, each SPDT switch selects for ground instead of the common terminal 145. But as DTC code increases, more and more of the SPDT switches select for the common terminal 145 instead of ground to charge their respective capacitor with the DAC reference voltage Vref_dac. For example, a maximum value for the three-bit DTC code may cause switches S4, S5, and S6 to select for the common terminal while switch S7 selects for ground. In that case, capacitors S4, S5, and S6 are all charged to the DAC reference voltage during the initial charging phase.

With the appropriate capacitors charged in the initial charging phase responsive to the DTC code, a charge redistribution phase occurs. The charge redistribution phase may begin by opening bottom switch S8. This advantageously prevents the charge on the capacitors in capacitor array 305 from being changed during the charge redistribution phase since the second plate for each capacitor is floating. More generally, ground may be replaced by a constant voltage source such that bottom switch S8 couples between the second plate of each capacitor and the constant voltage source. It will be appreciated that switch S8 may be replaced by a plurality of switches S8 in alternative implementations. With bottom switch S8 opened, switch S2 is also opened to isolate the common terminal from the DAC reference voltage Vref at node 140. All the SPDT switches are then configured to select for the common terminal 145 such that the first plate for each capacitor is connected to the common terminal 145. The charge on the first plates thus redistributes from those capacitors that were charged in the initial charging phase to those capacitors that were grounded in the initial charging phase. Note that the switching of the SPDT switches may be staggered or asynchronous due to non-idealities but no charge injection occurs due to the opening of bottom switch S8, which "locks" the total charge on all the capacitors due to the floating of the second plate for each of the capacitors. The redistribution phase is then completed by closing bottom switch S8. Common terminal 145 is thus charged to Vinit such that the input clock may be asserted to trigger the charging of the Vinit-charged charging capacitor through the closing of switch S1.

Figure 4:
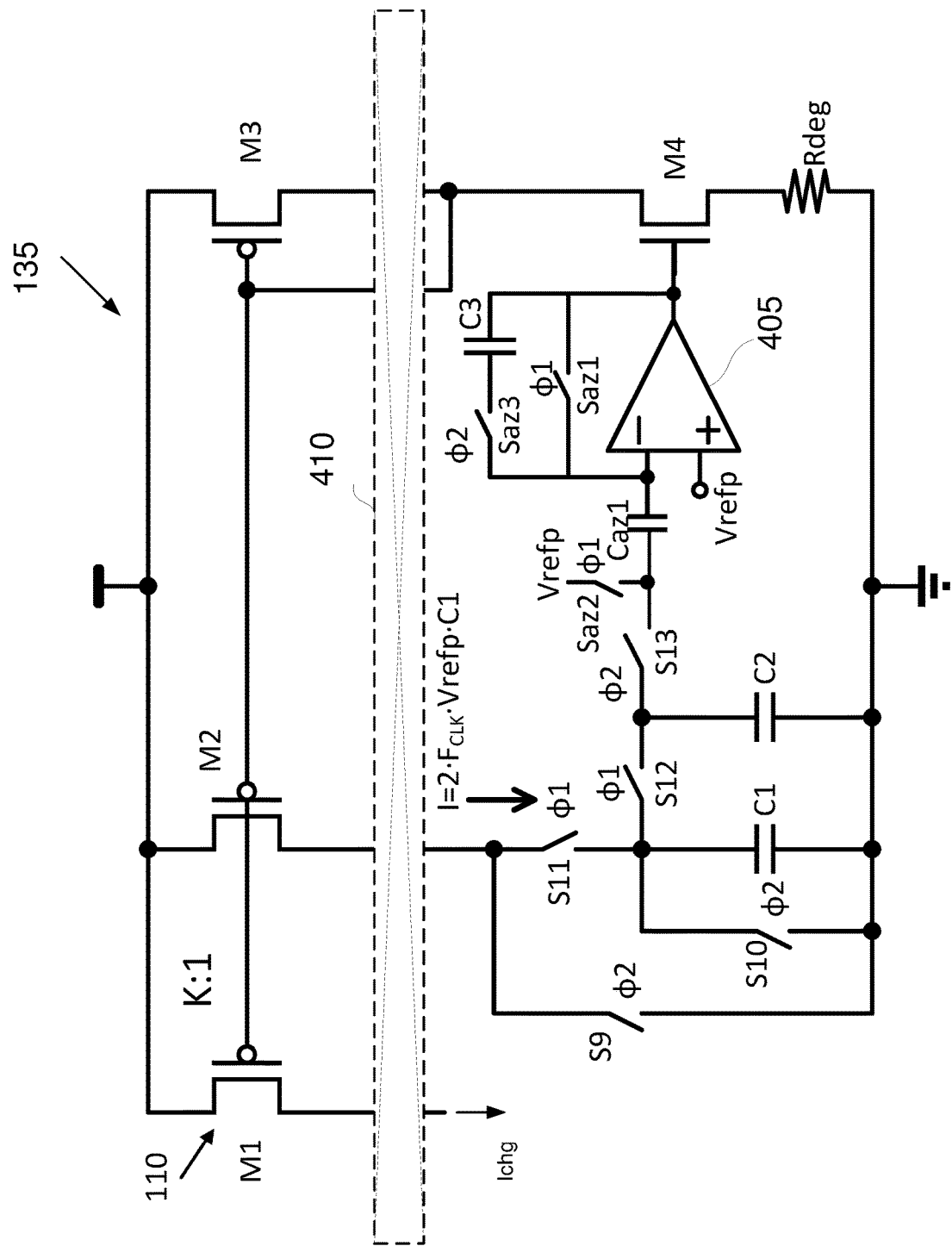
FIG. 4 is a circuit diagram of a switched capacitor voltage-to-current converter and a current mirror in accordance with an aspect of the disclosure.

An example switched capacitor voltage-to-current converter 135 with current mirror 110 is shown in FIG. 4. A differential amplifier 405 with a feedback capacitor C3 coupled between the output of differential amplifier 405 and its negative input terminal forms an error integrator that integrates a difference between the input reference voltage Vrefp and the negative input terminal voltage. In an implementation, amplifier 405 drives a gate of an NMOS transistor M4 having a source connected to a degeneration resistor Rdg (or ground in other implementations) and a drain connected to a drain and gate of a diode-connected PMOS transistor M3. Transistor M3 forms a current mirror with a current-mirror PMOS transistor M2. Similarly, transistor M3 forms the current mirror 110 with a current-mirror PMOS transistor M1. The sources of transistors M1, M2, and M3 connect to a power supply terminal for a power supply voltage. The gates of transistors M1 and M2 connect to the gate of diode-connected transistor M3. As amplifier 405 causes transistor M4 to conduct a current, that current is thus mirrored through transistors M3 and M1 to form a first current I that is mirrored by current mirror 110 to form the charging current Ichg. Transistor M1 is sized relative to transistor M2 so that the charging current Ichg is a factor K times the first current I. In an implementation, the drain of transistor M2 couples through a switch S11 to a first plate of a capacitor C1 and also couples through a switch S9 to ground. A second plate of capacitor C1 connects to ground. The first plate of capacitor C1 also couples to ground through a switch S10. In addition, the first plate of capacitor C1 couples to a first plate of a capacitor C2 through a switch S12. A second plate of capacitor C2 connects to ground. The first plate of capacitor C2 couples through a switch S13 to the negative input terminal of amplifier 405.

A clock source such as a crystal oscillator (not illustrated) generates a clock signal to control switches S9, S10, S11, S12, and S13. The clock signal oscillates between two phases at a frequency Fax. For example, a first phase 41 of the clock signal may correspond to when the clock signal is charged to a power supply voltage whereas a second phase $\phi 2$ may correspond to when the clock signal is discharged although these two phases may be reversed in alternative implementations. Switches S11 and S12 close when the clock signal is in phase $\phi 1$. During the phase $\phi 1$, the current I charges capacitors C1 and C2 through the closed switches S11 and S12. Switches S9, S10, and S13 are open during phase 41. In phase $\phi 2$, switches S9, S10 and S13 close whereas switches S11 and S12 open. In phase $\phi 2$, the charge on capacitor C2 drives the negative input terminal on amplifier 405. Capacitor C1 is discharged during phase $\phi 2$ and the first current I discharges to ground through closed switch S9. Given this clocking of the switches, it can be shown that the first current I equals $2*F_{CLK}*Vrefp*C1$. Current mirror transistor M1 mirrors the first current I such that the charging current Ichg equals the proportionality constant K times the first current I. The charging current Ichg thus equals $K*2*F_{CLK}*Vrefp*C1$. To show that this relationship for the charging current Ichg is quite advantageous in reducing process, voltage, and temperatures variations for the timing delay from the DTCs disclosed herein, consider that the maximum timing delay for the DTCs disclosed herein may be expressed as $C_{DAC}*(Vtrip/Ichg)$, where $C_{DAC}$ is the capacitance of CDAC capacitor array (the capacitance of the charging capacitor). If Vtrip and Vrefp are equal as discussed earlier, then the maximum delay may be expressed as $(\frac{1}{2}K)*(1/F_{CLK})*(C_{DAC}/C1)$. These factors are readily controlled precisely in an integrated circuit including DTC 100 in contrast to conventional DTCs that rely on the precision of resistors or capacitors.

The mismatch errors between transistors M1, M2 and M3 can be improved by using dynamic element matching (DEM) techniques through a switching matrix 410. Switching matrix 410 dynamically switches the drain connections of transistors M1, M2, and M3 so that the roles of transistors M1, M2, and M3 are dynamically swapped while the relative mirror ratios among them are kept unchanged. For example, in a first configuration of switching matrix 410, the drain of transistor M3 is connected to the drain of transistor M4 as shown in FIG. 4. But in a second configuration of switching matrix 410, the drain of transistor M3 is instead connected to switch S11. In this second configuration, the drain of current mirror transistor M2 may then be connected through the switching matrix 410 to the drain of transistor M4. Similarly, the drain of current mirror transistor M1 normally is coupled to switch S1 (FIG. 1) but is dynamically switched through switching matrix 410 in other switching configuration to instead connect either to switch S11 or to the drain of transistor M4. The resulting swapping of the current mirror elements can be triggered in phase $\phi 2$ with no impact on capacitor charging operations.

Referring again to FIG. 4, the offset of amplifier 405 can be removed by an auto-zero technique analogously as discussed with regard to comparator 115. During clock phase $\phi 1$, a switch Saz1 that connects between the negative input of amplifier 405 and the output of amplifier 405 as well as a switch Saz2 that connects between a node for the reference voltage Vrefp and a first plate of an auto-zero capacitor Caz1 are closed. A second plate of the auto-zero capacitor Caz1 connects to the negative input of amplifier 405. An auto-zero switch Saz3 that connects between the capacitor C3 and the negative input of amplifier 405 is open during clock phase φ1 to preserve the stored charge on capacitor C3. An offset voltage for amplifier 405 is thus sampled on the auto-zero capacitor Caz1 during the clock phase φ2. In phase φ2, switches Saz1 and Saz2 are opened and switch Saz3 closed so that the offset at the amplifier 405 is cancelled by the pre-charged capacitor Caz1. While the error signal from capacitor C2 is transferred by closing switch S13 during clock phase φ2, switch Saz3 is also closed to form the integrator with amplifier 405 and capacitor C3. The use of the switched capacitor voltage-to-current converter 135 in the generation of the charging current Ichg is thus quite advantageous with regard to ensuring that the timing delay produced by the DTC is robust to process, voltage, and temperature variations.

Figure 5:
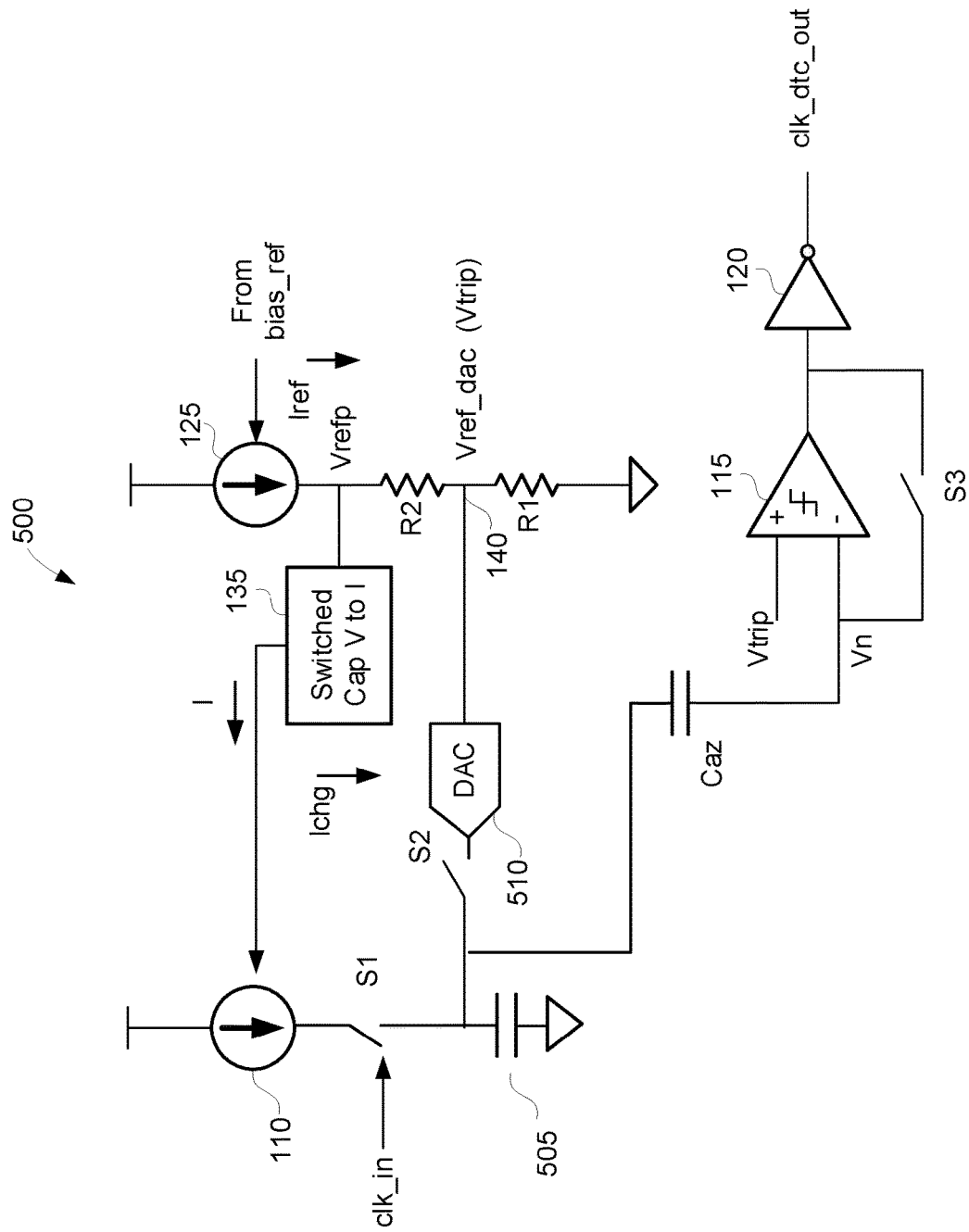
FIG. 5 is a diagram of an example DTC in which a switched capacitor voltage-to-current converter functions to generate the charging current for a charging capacitor in accordance with an aspect of the disclosure.

Turning now to FIG. 5, an example DTC 500 is shown in which the switched capacitor voltage-to-current converter 135 and current mirror 110 function to generate the charging current Ichg as discussed with regard to DTC 100. In DTC 500, a charging capacitor 505 is not integrated into a $C_{DAC}$ but instead is separately charged with the initial voltage Vinit as set by a DAC 510. The remaining component of DTC 500 function as discussed with regard to DTC 100. If a single $C_{DAC}$ were used to form charging capacitor 505 and DAC 510, DTC 500 resolves into DTC 100. However, even without the power and die space savings provided by the use of a $C_{DAC}$, DTC 500 is still robust to process, voltage, and temperature variations due to the use of the switched capacitor voltage-to-current converter 135 to generate the charging current Ichg.

Figure 6:
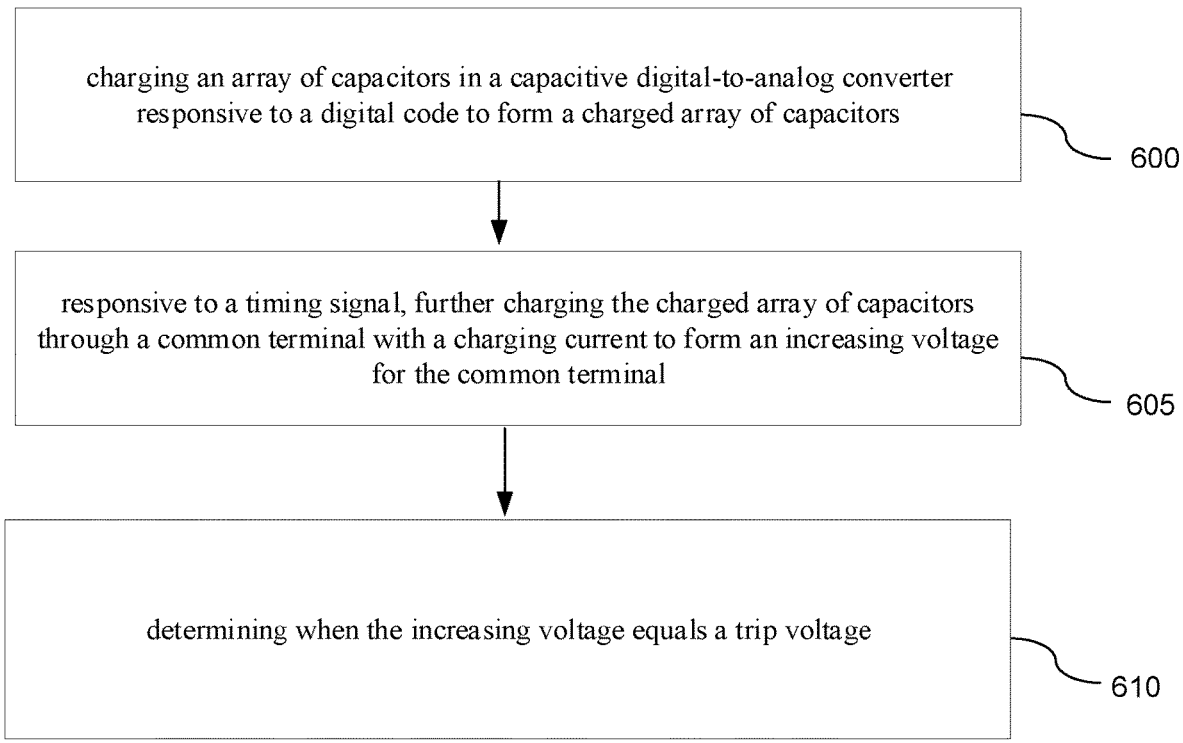
FIG. 6 is a flowchart for an example method of operation for a DTC in accordance with an aspect of the disclosure.

An example method of operation for a $C_{DAC}$-containing DTC will now be discussed with reference to the flowchart of FIG. 6. The method includes an act 600 of charging an array of capacitors in a capacitive digital-to-analog converter responsive to a digital code to form a charged array of capacitors. The charging of common terminal 145 for the array of capacitors to the initial voltage Vinit is an example of act 600. In addition, the method includes an act 605 that occurs responsive to an edge of a timing signal and includes further charging the charged array of capacitors through a common terminal with a charging current to form an increasing voltage for the common terminal. The charging of the $C_{DAC}$ capacitors through common terminal 145 after the triggering edge of the input clock signal is an example of act 605. Finally, the method includes an act 610 of determining when the increasing voltage equals a trip voltage. The comparison in comparator 115 is an example of act 610.

Figure 7:
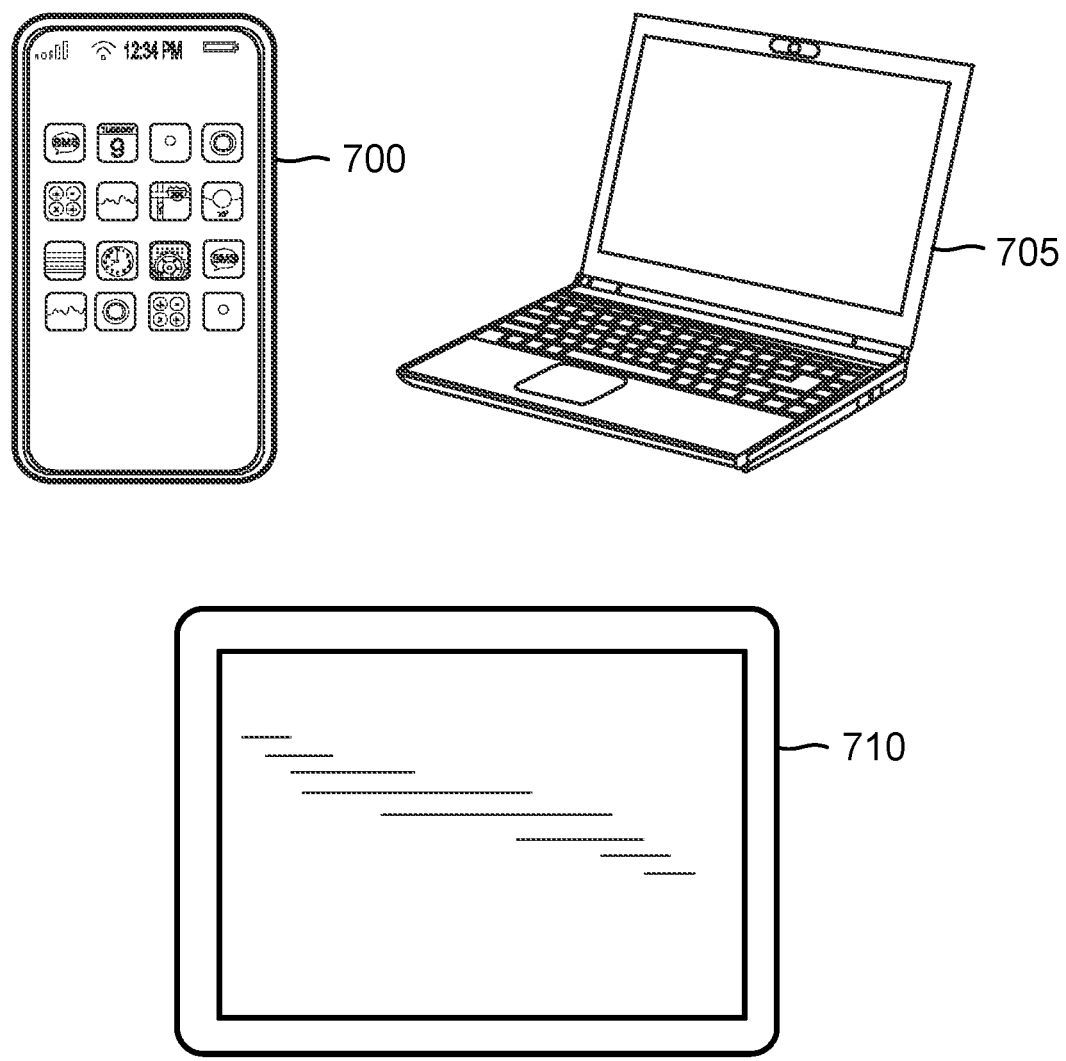
FIG. 7 illustrates some example electronic systems each incorporating a DTC in accordance with an aspect of the disclosure.

A DTC as disclosed herein may be advantageously incorporated in any suitable mobile device or electronic system. For example, as shown in FIG. 7, a cellular telephone 700, a laptop computer 705, and a tablet PC 710 may all include a DTC in accordance with the disclosure. Other exemplary electronic systems such as a music player, a video player, a communication device, and a personal computer may also be configured with DTCs constructed in accordance with the disclosure.

Figure 8:
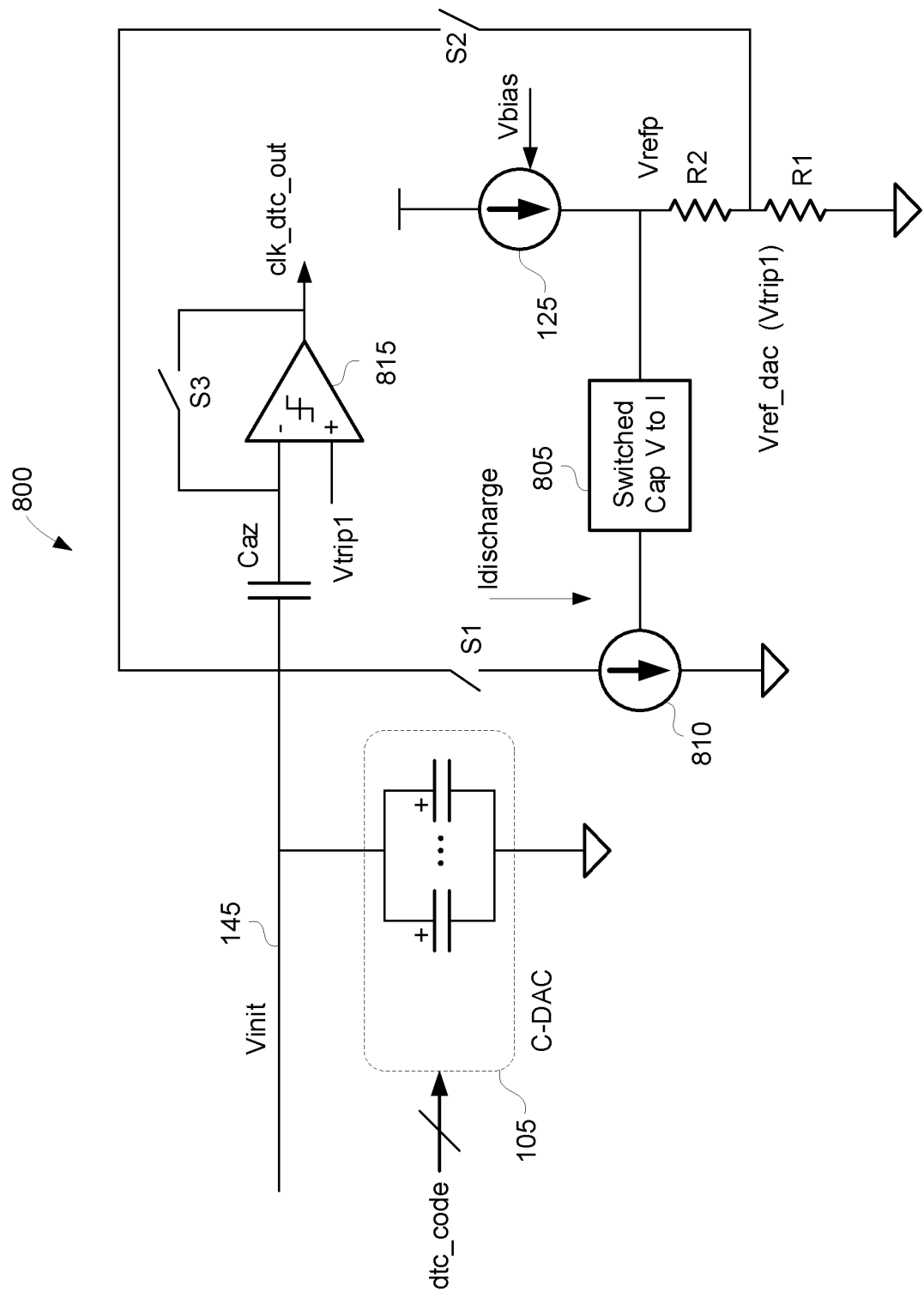
FIG. 8 is a diagram of an example DTC in which a CDAC functions as the charging capacitor that is discharged during the time delay in accordance with an aspect of the disclosure.

Referring again to DTC 100, the same advantageous density and power enhancements as well as robustness to process, voltage, and temperature variations may be provided in alternative implementations in which the charging capacitor formed by $C_{DAC}$ 105 is instead discharged during the time delay instead of being charged. An example discharging DTC 800 is shown in FIG. 8. A $C_{DAC}$ 105 functions as discussed with regard to DTC 100 to convert a digital code into an initial voltage Vinit stored by the $C_{DAC}$ capacitors with respect to common terminal 145 during a redistribution phase for $C_{DAC}$ 105. A current mirror 810 mirrors a first current from a switched capacitor voltage-to-current converter 805 to form a discharging current Idischarge. Current mirror 810 connects to the common terminal 145 through switch S1 analogously as discussed for DTC 100 so that when switch S1 is closed responsive to a triggering clock signal edge to start the time delay, the voltage Vinit begins to discharge as the discharging current Idischarge discharges the $C_{DAC}$ capacitors.

A comparator 815 also functions analogously as discussed with regard to comparator 115 to determine when the initial voltage Vinit has decreased to equal a trip voltage Vtrip1. However, whereas the trip voltage Vtrip for DTC 100 was greater than the initial voltage Vinit, the trip voltage Vtrip1 is less than the initial voltage Vinit. Since the output (clk_dtc_out) of comparator 815 will go high at the end of the time delay when the $C_{DAC}$ capacitors have been discharged to be less than the trip voltage Vtrip1, there is no need for an inverter equivalent to inverter 120 in DTC 800. The remainder of DTC 800 functions as discussed with regard to DTC 100.

The disclosure will now be summarized through the following list of clauses.

Clause 1. A circuit, comprising:
a capacitive digital-to-analog converter including a common terminal and a plurality of capacitors;
a first current source configured to charge the plurality of capacitors through the common terminal with a charging current; and
a comparator having a first input terminal coupled to the common terminal.

Clause 2. The circuit of clause 1, further comprising:
a first switch coupled between the first current source and the common terminal, the first switch being configured to be responsive to a timing signal.

Clause 3. The circuit of any of clauses 1 and 2, further comprising:
a switched capacitor voltage-to-current converter configured to convert a reference voltage into a first current, wherein the first current source comprises a current mirror configured to generate the charging current based on the first current.

Clause 4. The circuit of clause 3, further comprising:
at least one resistor; and
a second current source configured to drive a reference current through the at least one resistor to generate the reference voltage.

Clause 5. The circuit of clause 4, wherein the at least one resistor comprises a voltage divider having a node for a digital-to-analog (DAC) reference voltage for the capacitive digital-to-analog converter.

Clause 6. The circuit of clause 4, further comprising:
a second switch coupled between the node and the common terminal.

Clause 7. The circuit of any of clauses 6 and 7, wherein a second input terminal of the comparator is coupled to the node.

Clause 8. The circuit of any of clauses 1-7, wherein the circuit is a digital-to-time converter comprising:
an inverter configured to invert an output signal from the comparator to form an output clock signal for the digital-to-time converter.

Clause 9. The circuit of any of clauses 5-7, wherein the voltage divider comprises:
a first resistor coupled between the node and the second current source, and
a second resistor coupled between the node and ground.

Clause 10. The circuit of any of clauses 1-9, further comprising:
a second capacitor coupled between the first input terminal of the comparator and the common terminal.

Clause 11. The circuit of any of clauses 1-10, further comprising:
a switch connected between an output terminal of the comparator and the first input terminal.

Clause 12. The circuit of any of clauses 1-11, wherein the capacitive digital-to-analog converter further comprises:
a plurality of first switches corresponding to the plurality of capacitors, each first switch in the plurality of first switches coupled between a first plate for the corresponding capacitor in the plurality of capacitors and the common terminal, the first plurality of first switches being configured responsive to a digital code.

Clause 13. The circuit of clause 12, wherein a second plate of each capacitor in the plurality of capacitors is switchably coupled to ground.

Clause 14. The circuit of any of clauses 1-13, wherein the plurality of capacitors includes a series of capacitors having a binary progression of capacitances.

Clause 15. A method for operating a digital-to-time converter, comprising:
charging an array of capacitors in a capacitive digital-to-analog converter responsive to a digital code to form a charged array of capacitors;
responsive to a timing signal, further charging the charged array of capacitors through a common terminal with a charging current to form an increasing voltage for the common terminal; and
determining when the increasing voltage equals a trip voltage.

Clause 16. The method of clause 15, further comprising:
converting a reference voltage into a first current in a switched capacitor voltage-to-current converter; and
mirroring the first current in a current mirror to form the charging current, wherein a time delay for the digital-to-time converter equals a delay from a triggering edge of the timing signal to when the increasing voltage equals the trip voltage.

Clause 17. The method of clause 16, further comprising:
generating a reference current; and
driving the reference current through at least one resistor to form the reference voltage.

Clause 18. The method of clause 17, further comprising:
generating the trip voltage from the reference current.

Clause 19. The method of any of clauses 15-18, wherein the charging of the array of capacitors in the capacitive digital-to-analog converter to form the charged array of capacitors comprises:
in a first phase, charging a subset of the capacitors in the array of capacitors to the trip voltage to provide a charge to the subset of the capacitors; and
in a second phase, redistributing the charge from the subset of capacitors to all the capacitors in the array of capacitors to form the charged array of capacitors.

Clause 20. The method of clause 19, further comprising:
isolating the array of capacitors from a constant voltage source during the redistributing of the charge by opening one or more switches coupled between the array of capacitors and the constant voltage source.

Clause 21. The method of any of clauses 15-19, further comprising:
closing a switch responsive to the timing signal to couple a current source configured to source the charging current to the common terminal.

Clause 22. A circuit, comprising:
a voltage-to-current switched capacitor converter configured to convert a reference voltage into a first current;
a charging capacitor;
a current mirror configured to mirror the first current into a charging current for charging the charging capacitor; and
a comparator having a first input terminal coupled to the charging capacitor and a second input terminal configured to receive a trip voltage.

Clause 23. The circuit of clause 22, further comprising:
a switch configured to close responsive to a timing signal to couple the current mirror to the charging capacitor.

Clause 24. The circuit of any of clauses 22-23, further comprising:
a capacitive digital-to-analog converter including an array of capacitors for forming the charging capacitor.

Clause 25. The circuit of any of clauses 22-24, wherein the circuit is included within a cellular telephone.

Clause 26. A circuit, comprising:
a capacitive digital-to-analog converter including a common terminal and a plurality of capacitors;
a first current source configured to discharge the plurality of capacitors with a discharging current conducted through the common terminal; and
a comparator having a first input terminal coupled to the common terminal.

Clause 27. The circuit of clause 26, further comprising:
a first switch coupled between the first current source and the common terminal, the first switch being configured to close responsive to a timing signal.

Clause 28. The circuit of any of clauses 26-27, further comprising:
a switched capacitor voltage-to-current converter configured to convert a reference voltage into a first current, wherein the first current source comprises a current mirror configured to mirror the first current into the discharging current.

Clause 29. The circuit of clause 28, further comprising:
at least one resistor; and
a second current source configured to drive a reference current through the at least one resistor to generate the reference voltage.

Clause 30. The circuit of clause 29, wherein the at least one resistor comprises a voltage divider having a node for a digital-to-analog (DAC) reference voltage for the capacitive digital-to-analog converter.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:
1. A circuit, comprising:
a capacitive digital-to-analog converter including a common terminal and a plurality of capacitors;
a first current source configured to charge the plurality of capacitors through the common terminal with a charging current; and
a comparator having a first input terminal coupled to the common terminal.

2. The circuit of claim 1, further comprising:
a first switch coupled between the first current source and the common terminal, the first switch being configured to be responsive to a timing signal.

3. The circuit of claim 1, further comprising:
at least one resistor; and
a second current source configured to drive a reference current through the at least one resistor to generate a reference voltage.

4. The circuit of claim 3, further comprising:
a switched capacitor voltage-to-current converter configured to convert the reference voltage into a first current, wherein the first current source comprises a current mirror configured to generate the charging current based on the first current.

5. The circuit of claim 4, wherein the at least one resistor comprises a voltage divider having a node for a digital-to-analog (DAC) reference voltage for the capacitive digital-to-analog converter.

6. The circuit of claim 5, further comprising:
a second switch coupled between the node and the common terminal.

7. The circuit of claim 5, wherein a second input terminal of the comparator is coupled to the node.

8. The circuit of claim 7, wherein the circuit is a digital-to-time converter comprising:
an inverter configured to invert an output signal from the comparator to form an output clock signal for the digital-to-time converter.

9. The circuit of claim 5, wherein the voltage divider comprises:
a first resistor coupled between the node and the second current source, and
a second resistor coupled between the node and ground.

10. The circuit of claim 1, further comprising:
a second capacitor coupled between the first input terminal of the comparator and the common terminal.

11. The circuit of claim 1, further comprising:
a switch connected between an output terminal of the comparator and the first input terminal.

12. The circuit of claim 1, wherein the capacitive digital-to-analog converter further comprises:
a plurality of first switches corresponding to the plurality of capacitors, each first switch in the plurality of first switches coupled between a first plate for the corresponding capacitor in the plurality of capacitors and the common terminal, the first plurality of first switches being configured responsive to a digital code.

13. The circuit of claim 12, wherein a second plate of each capacitor in the plurality of capacitors is switchably coupled to ground.

14. The circuit of claim 12, wherein the plurality of capacitors includes a series of capacitors having a binary progression of capacitances.

15. A method for operating a digital-to-time converter, comprising:
charging an array of capacitors in a capacitive digital-to-analog converter responsive to a digital code to form a charged array of capacitors;
responsive to a timing signal, further charging the charged array of capacitors through a common terminal with a charging current to form an increasing voltage for the common terminal; and
determining when the increasing voltage equals a trip voltage.

16. The method of claim 15, further comprising:
converting a reference voltage into a first current in a switched capacitor voltage-to-current converter; and
mirroring the first current in a current mirror to form the charging current, wherein a time delay for the digital-to-time converter equals a delay from a triggering edge of the timing signal to when the increasing voltage equals the trip voltage.

17. The method of claim 16, further comprising:
generating a reference current; and
driving the reference current through at least one resistor to form the reference voltage.

18. The method of claim 17, further comprising:
generating the trip voltage from the reference current.

19. The method of claim 15, wherein the charging of the array of capacitors in the capacitive digital-to-analog converter to form the charged array of capacitors comprises:
in a first phase, charging a subset of the capacitors in the array of capacitors to the trip voltage to provide a charge to the subset of the capacitors; and
in a second phase, redistributing the charge from the subset of capacitors to all the capacitors in the array of capacitors to form the charged array of capacitors.

20. The method of claim 19, further comprising: isolating the array of capacitors from a constant voltage source during the redistributing of the charge by opening one or more switches coupled between the array of capacitors and the constant voltage source.

21. The method of claim 15, further comprising:
closing a switch responsive to the timing signal to couple a current source configured to source the charging current to the common terminal.

22. A circuit, comprising:
a voltage-to-current switched capacitor converter configured to convert a reference voltage into a first current;
a charging capacitor;
a current mirror configured to mirror the first current into a charging current for charging the charging capacitor; and
a comparator having a first input terminal coupled to the charging capacitor and a second input terminal configured to receive a trip voltage.

23. The circuit of claim 22, further comprising:
a switch configured to close responsive to a timing signal to couple the current mirror to the charging capacitor.

24. The circuit of claim 22, further comprising:
a capacitive digital-to-analog converter including an array of capacitors for forming the charging capacitor.

25. The circuit of claim 22, wherein the circuit is included within a cellular telephone.

26. A circuit, comprising:
a capacitive digital-to-analog converter including a common terminal and a plurality of capacitors;
a first current source configured to discharge the plurality of capacitors with a discharging current conducted through the common terminal; and
a comparator having a first input terminal coupled to the common terminal.

27. The circuit of claim 26, further comprising:
a first switch coupled between the first current source and the common terminal, the first switch being configured to close responsive to a timing signal.

28. The circuit of claim 26, further comprising:
a switched capacitor voltage-to-current converter configured to convert a reference voltage into a first current, wherein the first current source comprises a current mirror configured to mirror the first current into the discharging current.

29. The circuit of claim 28, further comprising:
at least one resistor; and
a second current source configured to drive a reference current through the at least one resistor to generate the reference voltage.

30. The circuit of claim 29, wherein the at least one resistor comprises a voltage divider having a node for a digital-to-analog (DAC) reference voltage for the capacitive digital-to-analog converter.

* * * * *